(12) United States Patent
Noh et al.

(10) Patent No.: US 12,347,496 B2
(45) Date of Patent: Jul. 1, 2025

(54) ELECTRONIC DEVICE AND METHOD OF OPERATING THE SAME

(71) Applicant: SK hynix Inc., Icheon-si (KR)

(72) Inventors: In Seob Noh, Icheon-si (KR); Jong Kyung Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 57 days.

(21) Appl. No.: 18/306,040

(22) Filed: Apr. 24, 2023

(65) Prior Publication Data

US 2024/0145009 A1 May 2, 2024

(30) Foreign Application Priority Data

Oct. 27, 2022 (KR) .......................... 10-2022-0140673

(51) Int. Cl.
*G11C 16/00* (2006.01)
*G11C 16/04* (2006.01)
*G11C 16/08* (2006.01)
*G11C 16/10* (2006.01)

(52) U.S. Cl.
CPC ........ *G11C 16/102* (2013.01); *G11C 16/0433* (2013.01); *G11C 16/08* (2013.01)

(58) Field of Classification Search
CPC ..... G11C 16/10; G11C 16/0483; G11C 16/32; G11C 16/3404; G11C 16/26; G11C 16/3459; G11C 16/08; G11C 11/5628; G11C 16/102; G11C 16/30; G11C 16/3427; G11C 2211/5621; G11C 11/5642; G11C 16/24; G11C 2211/5642; G11C 7/1039; G11C 7/106; G11C 7/1087; G11C 16/0433
See application file for complete search history.

(56) References Cited

U.S. PATENT DOCUMENTS 11,295,816 B2 * 4/2022 Park ................... G11C 16/3459

FOREIGN PATENT DOCUMENTS

KR 1020180013127 A 2/2018
KR 1020190023893 A 3/2019

* cited by examiner

*Primary Examiner* — Thong Q Le
(74) *Attorney, Agent, or Firm* — WILLIAM PARK & ASSOCIATES LTD.

(57) ABSTRACT

A memory device includes memory cells connected to a selected word line; a peripheral circuit configured to perform a first program operation of programming a threshold voltage of each of memory cells to a pre-threshold voltage less than a target threshold voltage, and perform a second program operation of programming the threshold voltage of each of the memory cells to the target threshold voltage after the first program operation is performed; and control logic configured to control the peripheral circuit so that a first pass voltage and a second pass voltage are sequentially applied to adjacent word lines, when a program voltage is applied to the selected word line, in the first program operation and the second program operation. A magnitude of the second pass voltage in the first program operation may be greater than a magnitude of the second pass voltage in the second program operation.

16 Claims, 15 Drawing Sheets

DISTRIBUTION OF ELECTRONS TRAPPED INSIDE CTN
AFTER FIRST PROGRAM OPERATION IS COMPLETED

1st program operation

2nd program operation

1st program operation

1st program operation

ELECTRONIC DEVICE AND METHOD OF OPERATING THE SAME

CROSS-REFERENCE TO RELATED APPLICATION

The present application claims priority under 35 U.S.C. § 119(a) to Korean patent application number 10-2022-0140673, filed on Oct. 27, 2022, in the Korean Intellectual Property Office, the entire disclosure of which is incorporated herein by reference.

BACKGROUND

1. Technical Field

The present disclosure relates to an electronic device, and more particularly, to a memory device and a method of operating the same.

2. Related Art

A storage device is a device that stores data under the control of a host device such as a computer or a smartphone. A storage device may include a memory device in which data is stored and a memory controller controlling the memory device. The memory device may be a volatile memory device or a nonvolatile memory device.

A volatile memory device is a device that stores data only when power is supplied and loses the stored data when the power supply is cut off. A volatile memory device includes volatile memory, such as: static random access memory (SRAM), dynamic random access memory (DRAM), and the like.

A nonvolatile memory device is a device that does not lose data even though power is cut off. A nonvolatile memory device includes nonvolatile memory, such as: read only memory (ROM), programmable ROM (PROM), electrically programmable ROM (EPROM), electrically erasable and programmable ROM (EEPROM), flash memory, and the like.

SUMMARY

An embodiment of the present disclosure may provide a memory device having an improved threshold voltage distribution after a program operation.

According to an embodiment of the present disclosure, a memory device may include: memory cells connected to a selected word line among a plurality of word lines; a peripheral circuit configured to perform a first program operation of programming a threshold voltage of each of memory cells that are to be programmed among the memory cells to a pre-threshold voltage less than a target threshold voltage, and perform a second program operation of programming the threshold voltage of each of the memory cells which are to be programmed to the target threshold voltage after the first program operation is performed; and control logic configured to control the peripheral circuit so that a first pass voltage and a second pass voltage are sequentially applied to adjacent word lines adjacent to the selected word line, when a program voltage is applied to the selected word line, in the first program operation and the second program operation. A magnitude of the second pass voltage applied to the adjacent word lines in the first program operation may be greater than a magnitude of the second pass voltage applied to the adjacent word lines in the second program operation.

According to the present disclosure is a method of operating a memory device performing a program operation on memory cells connected to a selected word line among a plurality of word lines. The method may include: performing a first program operation of programming a threshold voltage of each of memory cells that are to be programmed among memory cells connected to the selected word line to a pre-threshold voltage less than a target threshold voltage; and performing a second program operation of programming the threshold voltage of each of the memory cells which are to be programmed to the target threshold voltage after the first program operation is performed. Each of the first program operation and the second program operation may include applying a program voltage to the selected word line and sequentially applying a first pass voltage and a second pass voltage to adjacent word lines adjacent to the selected word line. A magnitude of the second pass voltage applied to the adjacent word lines in the first program operation may be greater than a magnitude of the second pass voltage applied to the adjacent word lines in the second program operation.

According to an embodiment of the present disclosure, a memory device may include: memory cells connected to a selected word line among a plurality of word lines; a peripheral circuit configured to perform a first program operation of programming a threshold voltage of each of memory cells that are to be programmed among the memory cells to a pre-threshold voltage less than a target threshold voltage, and perform a second program operation of programming the threshold voltage of each of the memory cells, which are to be programmed, to the target threshold voltage after the first program operation is performed; and control logic configured to control the peripheral circuit to apply a program voltage to the selected word line and apply a pass voltage to adjacent word lines adjacent to the selected word line in the first program operation, and apply the program voltage to the selected word line and sequentially apply a first pass voltage and a second pass voltage to the adjacent word lines in the second program operation. A magnitude of the second pass voltage applied to the adjacent word lines in the first program operation may be greater than or equal to a magnitude of the second pass voltage applied to the adjacent word lines in the second program operation.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, the present disclosure is described in detail by describing a limited number of possible embodiments of the present disclosure with reference to the accompanying drawings. Hereinafter, an embodiment of the present disclosure is described in detail with reference to the accompanying drawings.

Figure 1:
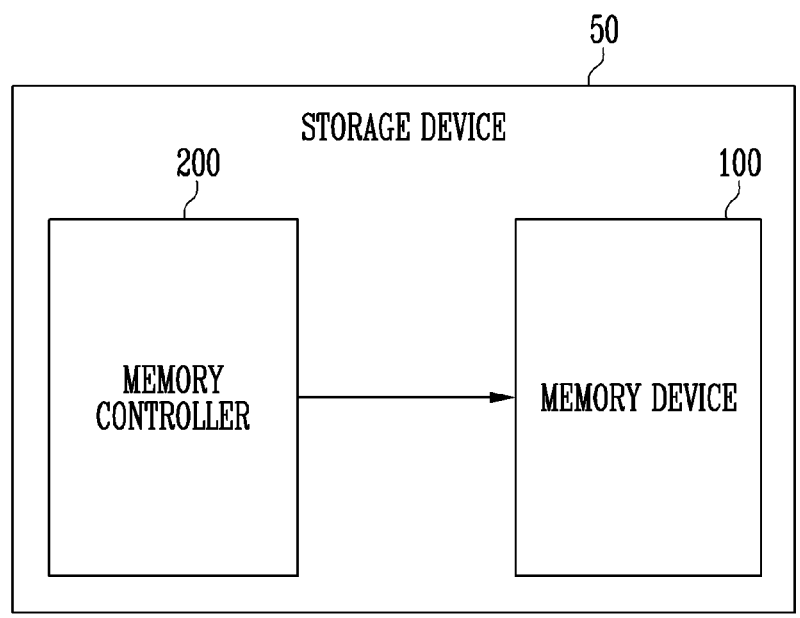
FIG. 1 is a diagram illustrating a storage device according to an embodiment.

FIG. 1 is a diagram illustrating a storage device according to an embodiment.

Referring to FIG. 1, the storage device 50 may include a memory device 100 and a memory controller 200 that controls an operation of the memory device.

The storage device 50 may be manufactured as one of various types of storage devices according to a host interface that is a communication method with the host. In addition, the storage device 50 may be manufactured as any one of various types of packages.

The memory device 100 may store data. The memory device 100 operates under control of the memory controller 200. The memory device 100 may include a memory cell array including a plurality of memory cells that store data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

The memory device 100 is configured to receive a command and an address from the memory controller 200 and access an area selected by the address of the memory cell array. For example, the memory device 100 may perform a write operation (program operation), a read operation, and an erase operation.

In an embodiment, the memory device 100 may sequentially perform a first program operation and a second program operation on the selected area. The first program operation may be an operation of programming a threshold voltage of each of memory cells connected to a selected word line among a plurality of memory cells to an erase state or any one state among a plurality of intermediate states. The second program operation may be an operation of programming the threshold voltage of each of the selected memory cells so that the threshold voltage corresponds to a target state among a plurality of states after the first program operation is performed.

In an embodiment, the memory device 100 may apply a second pass voltage of a magnitude increased by an offset voltage of a predetermined magnitude compared to a first pass voltage to adjacent word lines after a predetermined time elapses, after the first pass voltage is applied to the adjacent word line, while a program voltage is applied to the selected word line.

The memory controller 200 controls an overall operation of the storage device 50.

When power is applied to the storage device 50, the memory controller 200 may execute firmware (FW). When the memory device 100 is a flash memory device, the memory controller 200 may operate firmware such as a flash translation layer (FTL) for controlling communication between the host and the memory device 100.

In an embodiment, the memory controller 200 may receive data and a logical block address (LBA) from the host and convert the LBA into a physical block address (PBA) indicating an address of memory cells in which data included in the memory device 100 is to be stored.

The memory controller 200 may control the memory device 100 to perform the program operation, the read operation, or the erase operation in response to a request of the host. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may provide the command, the address, and the data to the memory device 100 to perform background operations such as a program operation for wear leveling and a program operation for garbage collection independently without the request from the host. In an embodiment, the memory controller 200 may control at least two or more memory devices 100 according to an interleaving method.

The host may communicate with the storage device 50 using at least one of various communication methods.

Figure 2:
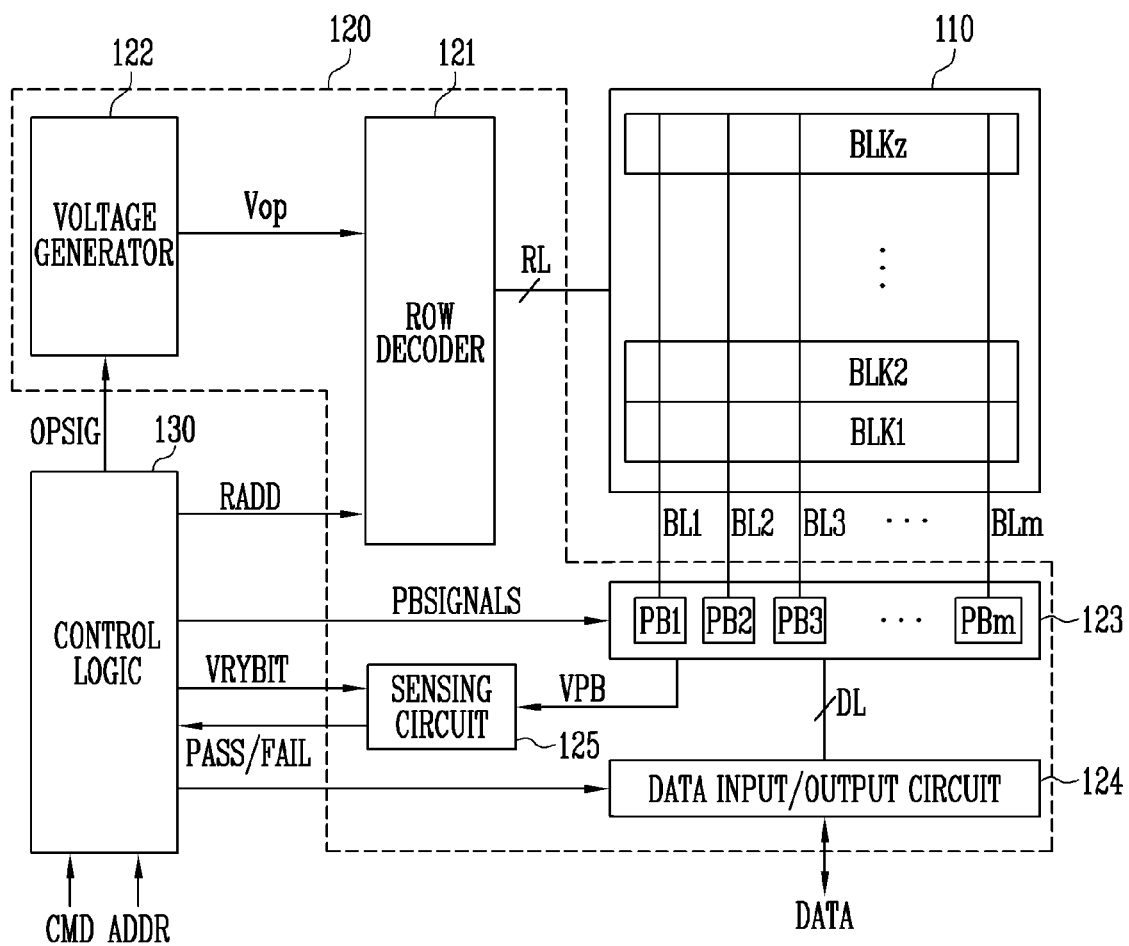
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. Each of the memory cells of the memory device 100 may be configured as a single-level cell (SLC) that stores one data bit, a multi-level cell (MLC) that stores two data bits, a triple-level cell (TLC) that stores three data bits, or a quad-level cell (QLC) that stores four data bits.

The peripheral circuit 120 may include a row decoder 121, a voltage generator 122, a read and write circuit 123, a data input/output circuit 124, and a sensing circuit 125. For example, the peripheral circuit 120 may drive the memory cell array 110 to perform a program operation, a read operation, and an erase operation.

The row decoder 121 is connected to the memory cell array 110 through the row lines RL. The row lines RL may include at least one source select line, a plurality of word lines, and at least one drain select line.

The row decoder 121 is configured to decode a row address RADD received from the control logic 130. The row decoder 121 selects at least one memory block among the memory blocks BLK1 to BLKz according to the decoded address. In addition, the row decoder 121 may select at least one word line of the selected memory block to apply voltages generated by the voltage generator 122 to the at least one word line according to the decoded address.

For example, during the program operation, the row decoder 121 may apply the program voltage to the selected word line and apply a program pass voltage of a level less than that of the program voltage to unselected word lines. During a program verify operation, the row decoder 121 may apply a verify voltage to the selected word line and apply a verify pass voltage greater than the verify voltage to the unselected word lines.

The voltage generator 122 is configured to generate a plurality of erase voltages, a plurality of program voltages, a plurality of pass voltages, a plurality of select read voltages, and a plurality of unselect read voltages using an external power voltage supplied to the memory device 100.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm communicate data DATA with the data input/output circuit 124.

The data input/output circuit 124 is connected to the first to m-th page buffers PB1 to PBm. The data input/output circuit 124 receives the data DATA to be stored from an external controller (not shown) or outputs the data DATA transferred from the first to m-th page buffers PB1 to PBm to the external controller.

During the read operation or the verify operation, a sensing circuit 125 may generate a reference current in response to a signal of an allowable bit VRYBIT generated by the control logic 130 and may compare a sensing voltage VPB received from the read and write circuit 123 with a reference voltage generated by the reference current to output a pass signal PASS or a fail signal FAIL to the control logic 130.

In an embodiment, the peripheral circuit 120 may sequentially perform the first program operation and the second program operation on the memory cells.

The control logic 130 may be implemented as hardware, software, or a combination of hardware and software. For example, the control logic 130 may be a control logic circuit operating in accordance with an algorithm and/or a processor executing control logic code. The control logic 130 may be connected to the row decoder 121, the voltage generator 122, the read and write circuit 123, the data input/output circuit 124, and the sensing circuit 125. The control logic 130 may generate an operation signal OPSIG, the row address RADD, a read and write circuit control signal PBSIGNALS, and the allowable bit VRYBIT in response to the command CMD and the address ADDR to control the peripheral circuit 120.

In an embodiment, the control logic 130 may control the peripheral circuit 120 to apply the program voltage to the selected word line in the first program operation and the second program operation and apply the first pass voltage and the second pass voltage to the adjacent word lines.

The control logic 130 may control the peripheral circuit 120 so that a magnitude of the second pass voltage applied to the adjacent word lines in the first program operation is greater than a magnitude of the second pass voltage applied to the adjacent word lines in the second program operation.

Figure 3:
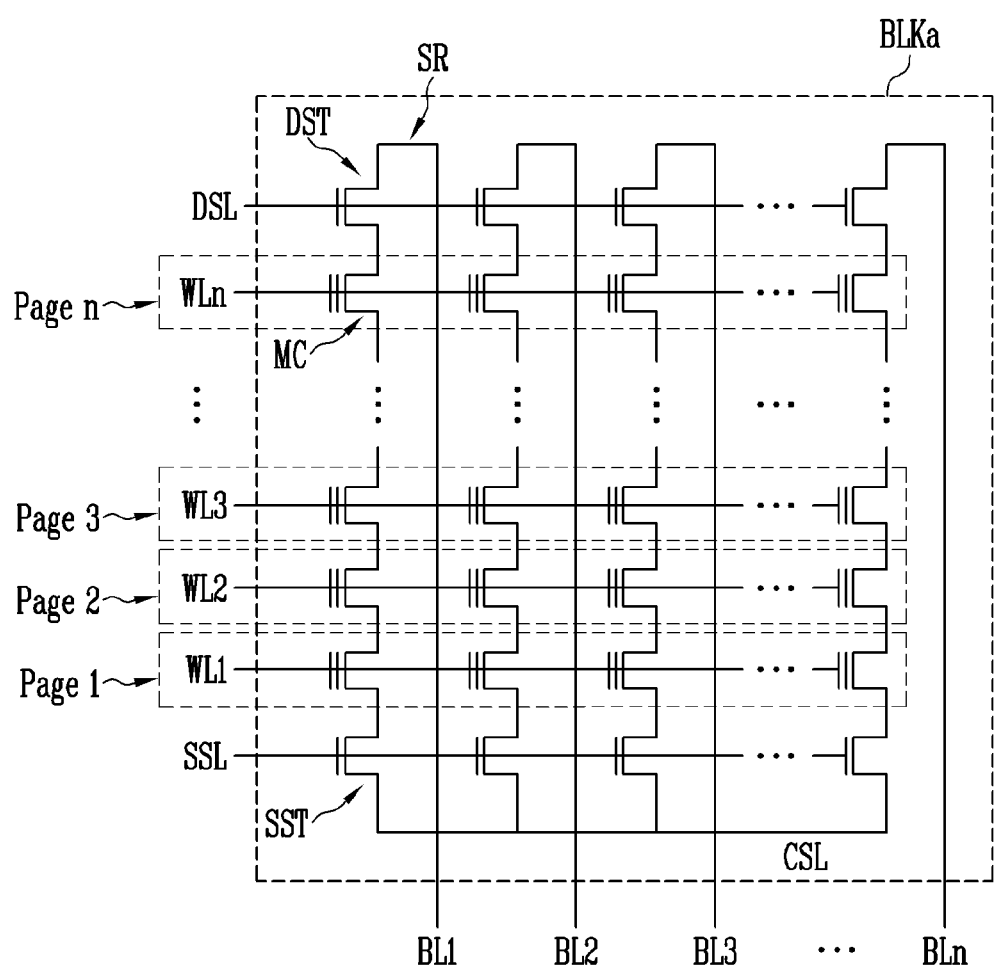
FIG. 3 is a circuit diagram illustrating any one memory block BLKa among memory blocks BLK1 to BLKz of FIG. 2.

FIG. 3 is a circuit diagram illustrating any one memory block BLKa among the memory blocks BLK1 to BLKz of FIG. 2.

Referring to FIG. 3, the memory block BLKa may include a plurality of strings SR. The plurality of strings SR may be connected to a plurality of bit lines BL1 to BLn, respectively. Each string SR may include a source select transistor SST, memory cells MC, and a drain select transistor DST. The source select transistor SST of each string SR may be connected between the memory cells MC and the common source line CSL. The source select transistors SST of the plurality of strings SR may be commonly connected to a common source line CSL. The drain select transistor DST of each string SR may be connected between the memory cells MC and the bit line BL. The drain select transistors DST of the plurality of strings SR may be connected to the plurality of bit lines BL1 to BLn, respectively. In each string SR, the plurality of memory cells MC are provided between the source select transistor SST and the drain select transistor DST. In each string SR, the plurality of memory cells MC may be connected in series.

In the plurality of strings SR, the memory cells MC positioned in the same order from the common source line CSL may be commonly connected to one word line. The memory cells MC of the plurality of strings SR may be connected to a plurality of word lines WL1 to WLn.

Memory cells connected to the same word line in the plurality of strings SR arranged in a row direction may configure one page PAGE. For example, in the plurality of strings SR, memory cells connected to a first word line WL1 may configure a first page PAGE 1. Memory cells connected to a second word line WL2 may configure a second page PAGE 2. Memory cells connected to a third word line WL3 may configure a third page PAGE 3. Memory cells connected to an n-th word line WLn may configure an n-th page PAGE n.

The memory device may perform the program operation on the selected memory cells in response to the program command provided from the memory controller. The program operation may be performed in a page unit corresponding to each of the word lines WL1 to WLn.

In an embodiment, the program operation corresponding to the program command of the memory controller may be sequentially performed on a plurality of pages according to a position of a word line corresponding to each page. For example, the memory controller may select a first page PAGE 1 to an n-th page PAGE n as program target pages. The memory controller may control the memory device so that the program operation is sequentially performed from the first page PAGE 1 to the n-th page PAGE n.

An order of the program operations on the plurality of pages is not limited by the present embodiment, and the memory controller may control the memory device so that the program operation is sequentially performed from the n-th page PAGE n to the first page PAGE 1.

Figure 4:
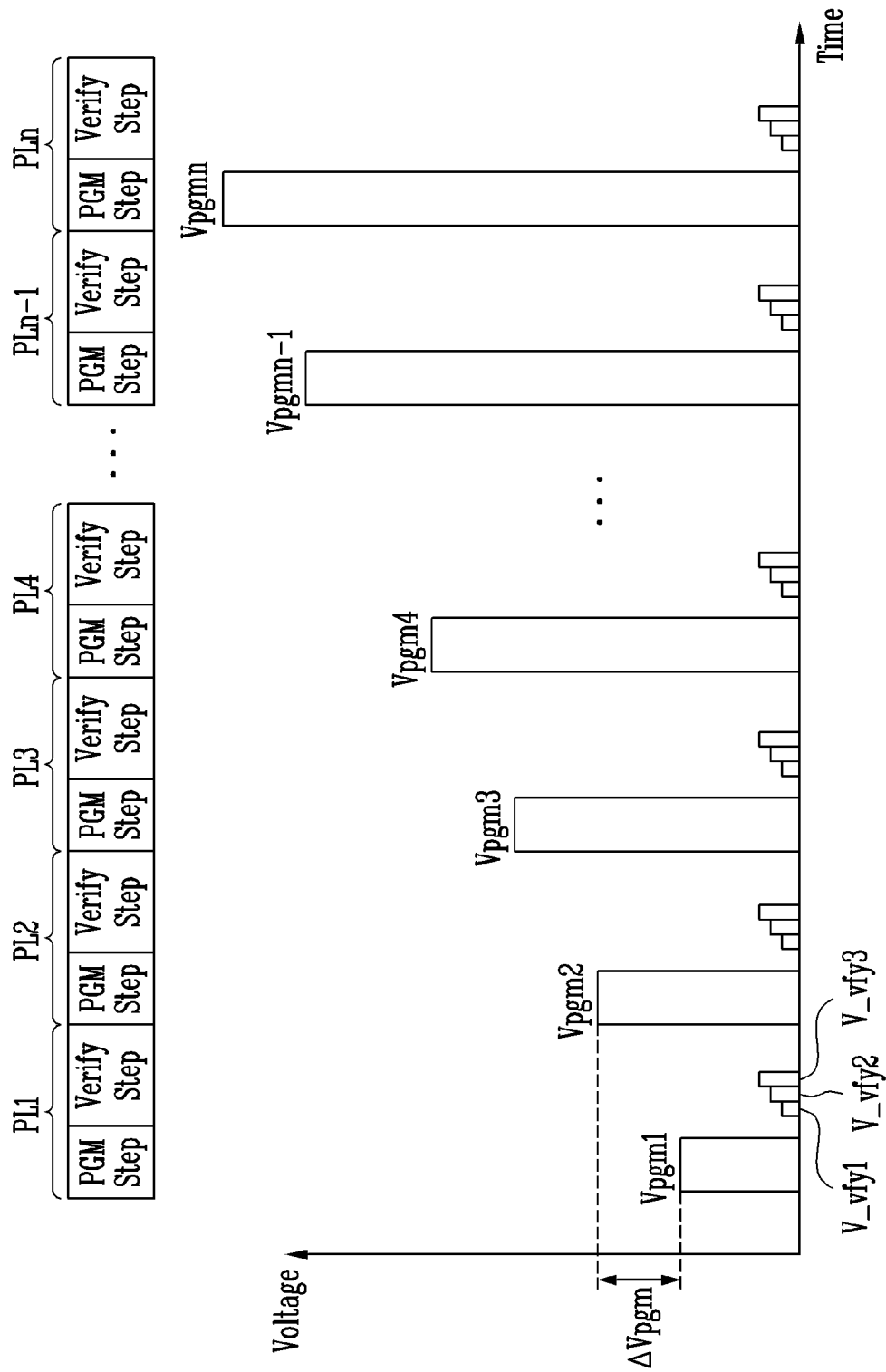
FIG. 4 is a diagram illustrating a program operation according to an embodiment.

FIG. 4 is a diagram illustrating a program operation according to an embodiment.

Referring to FIG. 4, the program operation may include a plurality of program loops PL1 to PLn. The memory device may perform the plurality of program loops PL1 to PLn to program the selected memory cells to have any one program state among a plurality of program states.

Each of the plurality of program loops PL1 to PLn may include a program voltage apply step PGM Step of applying the program voltage and a verify step Verify Step of determining whether the memory cells are programmed by applying verify voltages.

In the program voltage apply step, a program voltage apply operation of applying the program voltage to the selected word line connected to the selected memory cells may be performed. The selected memory cells may be programmed to any one program state among first to n-th (n is a natural number) state by the program voltage apply operation.

In an embodiment, the program voltage may be determined according to an incremental step pulse programming (ISPP) method. That is, a level of the program voltage may increase or decrease stepwise by a step voltage as the program loops are repeated. The application number, a voltage level, a voltage application time, and the like of the program voltages used in each program loop may be determined in various ways according to control of the memory controller.

The pass voltage may be applied to the unselected word lines that are word lines other than the selected word line. In an embodiment, pass voltages having the same level may be applied to the unselected word lines. In an embodiment, the pass voltage may have different levels according to a position of the word line.

A ground voltage may be applied as the program allowable voltage to the selected bit lines connected to the memory cell to be programmed. The program inhibition voltage may be applied to unselected bit lines that are bit lines connected to memory cells other than the memory cells to be programmed.

In the program verify step, the memory device may apply the verify voltage to the selected word line and apply the verify pass voltage to the unselected word lines. The memory device may sense a voltage or a current output through the bit lines to which the memory cells connected to the selected word line are respectively connected, and determine whether the verify step is passed or failed based on a sensed result.

In the verify step, the program verify operation may be performed on at least one program state among the first to n-th program states. For example, when memory cells to be programmed to a k-th (k is a natural number equal to or greater than 1 and equal to or less than n) state are read as off-cells by the verify voltage corresponding to the k-th state, the program verify operation on the k-th state may be passed.

In FIG. 4, when the selected memory cells are MLCs storing two data bits, the selected memory cells may be programmed to any one program state among an erase state and first to third program states. The number of data bits stored in the memory cell is not limited to the present embodiment.

When the first program loop PL1 is performed, after a first program voltage Vpgm1 is applied, first to third verify voltages V_vfy1 to V_vfy3 are sequentially applied to verify the program state of the plurality of memory cells. At this time, memory cells of which a target state is a first program state may be verified by the first verify voltage V_vfy1, memory cells of which a target state is a second program state may be verified by the second verify voltage V_vfy2, and memory cells of which a target state is a third program state may be verified by the third verify voltage V_vfy3. The number of verify voltages is not limited to the present embodiment.

The memory cells of which the verification is passed through each of the verify voltages V_vfy1 to V_vfy3 may be determined to have the target state, and then may be program-inhibited in a second program loop PL2. The program inhibition voltage may be applied to a bit line connected to the program-inhibited memory cells. A second program voltage Vpgm2 higher than the first program voltage Vpgm1 by a unit voltage ΔVpgm is applied to the selected word line in the second program loop PL2.

Thereafter, the verify operation is performed identically to the verify operation of the first program loop PL1. For example, a verify pass indicates that a memory cell is read as an off-cell by a corresponding verify voltage.

As described above, when the memory device programs the MLC, the memory device verifies the memory cells having the respective program states as the target states using the first to third verify voltages V_vfy1 to V_vfy3.

Figure 5:
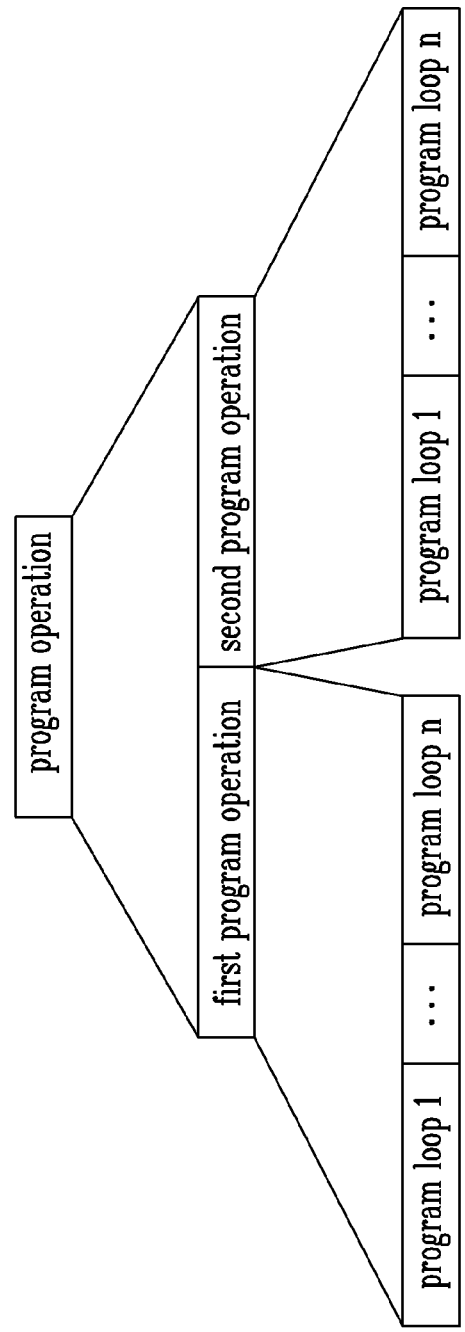
FIG. 5 is a diagram illustrating a sequence of a program operation according to an embodiment.

FIG. 5 is a diagram illustrating a sequence of a program operation according to an embodiment.

In an embodiment, the memory device may sequentially perform the first program operation and the second program operation on the selected memory cells. For example, each of the first program operation and the second program operation may include a plurality of program loops. As described with reference to FIG. 4, each of the plurality of program loops may include the program voltage apply step and the verify step. The program voltage apply step may be a step of applying the program voltage to the selected word line connected to the selected memory cells. The program voltage may increase by the step voltage whenever the program loop increases. The verify step may be a step of confirming whether the selected memory cell is programmed to a targeted program state.

In the program voltage apply step of the first program operation and the second program operation, the program voltage may be applied to the selected word line, and the pass voltage may be applied to the unselected word lines. The first pass voltage and the second pass voltage may be sequentially applied to the word lines adjacent to the selected word line among the unselected word lines. That is, the second pass voltage of the magnitude increased by the offset voltage of the predetermined magnitude compared to the first pass voltage may be applied to the adjacent word lines after the predetermined time elapses after the first pass voltage is applied.

Figure 6:
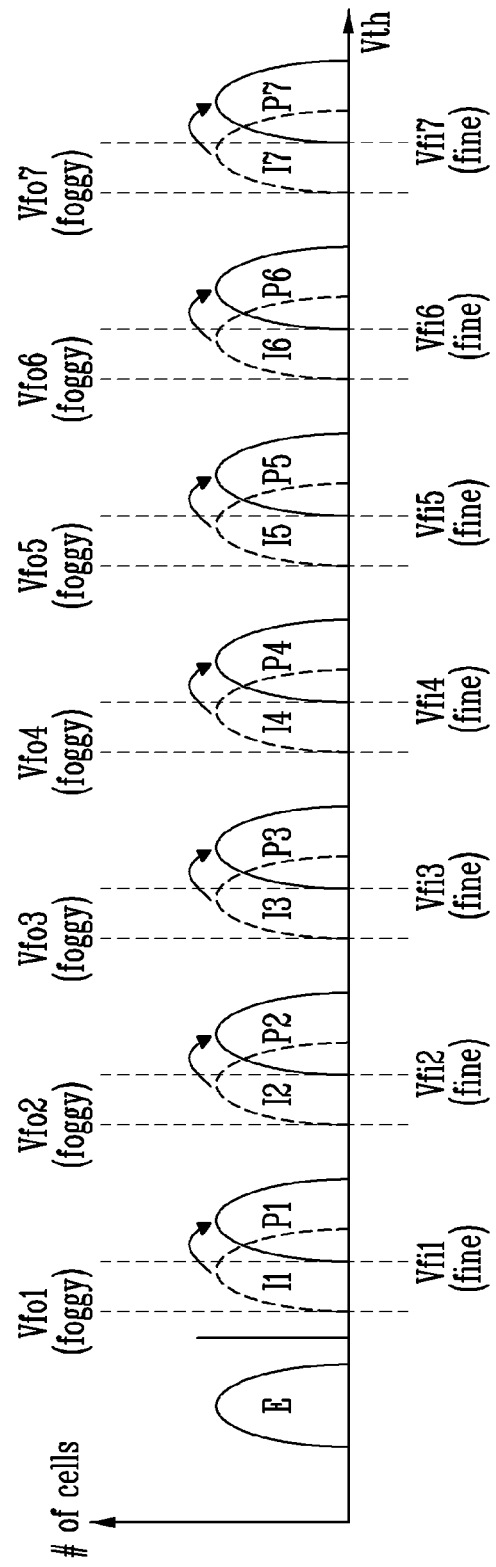
FIG. 6 is a diagram illustrating a first program operation and a second program operation according to an embodiment.

FIG. 6 is a diagram illustrating a first program operation and a second program operation according to an embodiment.

Referring to FIG. 6, a horizontal axis represents a threshold voltage of memory cells, and a vertical axis represents the number of memory cells. In FIG. 6, one memory cell may be configured as a TLC that stores three bits of data. However, the present disclosure is not limited thereto, and the number of bits of data that each of the memory cells included in the memory device may store may be variously set.

In an embodiment, the first program operation may be a foggy program operation, and the second program operation may be a fine program operation. The memory cell may store data by performing the foggy program operation and the fine program operation. FIG. 6 is a diagram illustrating a threshold voltage distribution of a case where the foggy program operation and the fine program operation are performed on the memory cells configuring one page. Specifically, a dotted line represents the threshold voltage distribution of the memory cells after the foggy program operation is performed, and a solid line represents the threshold voltage distribution of the memory cells after the fine program operation is performed.

The program operation may be divided into the foggy program operation and the fine program operation and may both be performed. That is, the foggy program operation and the fine program operation may both be required to be performed on the memory cells to complete the program operation. When the program operation is completed, each memory cell may have a threshold voltage corresponding to any one of a plurality of program states divided according to data stored in a corresponding memory cell.

For example, the memory cell may be programmed to any one of an erase state E and first to seventh program states P1 to P7. That the memory cell is programmed may mean having a threshold voltage belonging to a threshold voltage distribution of a corresponding state.

The memory cells may have a threshold voltage belonging to any one of the threshold voltage distribution of the erase state E or first to seventh intermediate states I1 to I7 by the foggy program operation. For example, memory cells to be programmed to the first program state P1 may have the threshold voltage of the first intermediate state I1. Memory cells to be programmed to the second program state P2 to the seventh program state P7 may have the threshold voltages corresponding to the second intermediate state I2 to the seventh intermediate state I7, respectively. In an embodiment, a threshold voltage of an intermediate state may be a pre-threshold voltage. A magnitude of the pre-threshold voltage may be less than a magnitude of a target threshold voltage.

During the foggy program operation, a verify operation using foggy verify voltages Vfo1 to Vfo7 may be performed. During the fine program operation, a verify operation using fine verify voltages Vfi1 to Vfi7 may be performed.

After the foggy program operation is performed, the fine program operation may be performed. The fine program operation may be an operation of programming the memory cells to have the target threshold voltage. The target threshold voltage may be a threshold voltage corresponding to a state corresponding to data to be stored in the memory cells. That is, the fine program operation may be an operation of programming the memory cells to have the threshold voltage corresponding to the state corresponding to the data to be stored in the memory cells. When the fine program operation is performed, each of the memory cells may have the threshold voltage corresponding to any one of the erase state E and the first to seventh program states P1 to P7.

In an embodiment, the foggy program operation may correspond to the first program operation, and the fine program operation may correspond to the second program operation. That is, the memory device may perform the foggy program operation on the selected memory cells as the first program operation. When the foggy program operation on the selected memory cells is completed, the memory device may perform the fine program operation on the selected memory cells as the second program operation.

The first program operation and the second program operation may not be limited to the foggy program operation and the fine program operation described above and may be implemented in various forms.

For example, the first program operation may be for pre-programming the selected memory cells to an intermediate state, and the second program operation may be for main programming the selected memory cells to a target program state.

Figure 7:
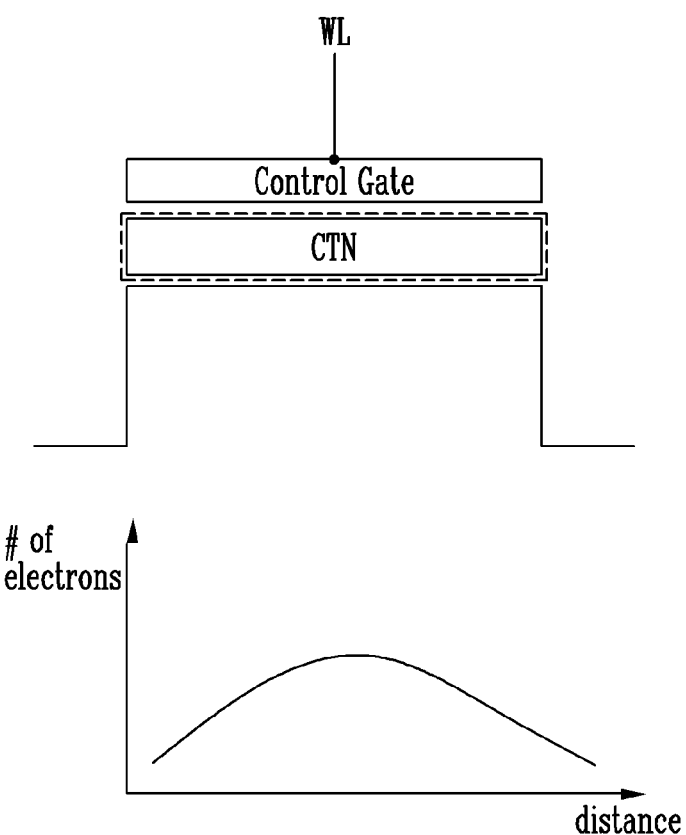
FIG. 7 is a diagram illustrating a distribution of electrons trapped inside a charge trap film of a programmed memory cell after completion of a first program operation according to an embodiment.

FIG. 7 is a diagram illustrating a distribution of electrons trapped inside a charge trap film of a programmed memory cell after completion of a first program operation according to an embodiment.

An upper diagram of FIG. 7 shows a structure of any one memory cell among the plurality of memory cells shown in FIG. 3. Referring to the upper drawing of FIG. 7, the memory cell may include a control gate Control Gate and a charge trap film CTN. The control gate Control Gate may be connected to the word line WL. When the memory device performs the program operation on the memory cell, the program voltage may be applied to the control gate Control Gate through the word line WL. When the program voltage is applied to the control gate Control Gate in the program operation of the memory cell, a plurality of electrons may be trapped inside the charge trap film CTN. As the number of electrons trapped in the memory cell increases, the threshold voltage of the memory cell may increase.

A lower graph of FIG. 7 illustrates an example of the distribution of the electrons trapped inside the charge trap film CTN. Referring to the lower graph of FIG. 7, the electrons trapped inside the charge trap film CTN may form a distribution having a Gaussian shape, in which the concentration of electrons increase from both ends toward the center of the charge trap film CTN.

The electrons positioned at both ends of the charge trap film CTN may cause early retention. The early retention may occur due to a phenomenon in which the electrons trapped in the charge trap film of the memory cell escape from the charge trap film within a short time after the program operation on the memory cell. When the electrons escape from the charge trap film, the threshold voltage of the programmed memory cells may shift.

In an embodiment, the memory device may adjust conditions of the program operation so that the distribution of the electrons trapped in the charge trap film of the selected memory cells are widely formed after the first program operation on the selected memory cells is completed. In other words, the memory device may adjust program conditions so that relatively more electrons are positioned at both ends of the charge trap film after the first program operation is completed. As the number of electrons positioned at both ends of the charge trap film after the first program operation is performed increases, an amount of the electrons escaping from the charge trap film before the second program operation is performed may increase. At this time, as the amount of the electrons escaping from the charge trap film increases, the threshold voltage distribution of the selected memory cells after the second program operation is completed may be narrowed. In an embodiment, the first program operation and the second program operation may refer to the foggy program operation and the fine program operation, respectively, described with reference to FIG. 6.

In an embodiment, the memory device may increase a magnitude of the pass voltage applied to the adjacent word lines or increase a time period for which the pass voltage is applied to the adjacent word lines, to widely form the distribution of the electrons trapped in the charge trap film of the selected memory cells.

In an embodiment, to widely form the distribution of the electrons trapped in the charge trap film of the selected memory cells, the memory device may apply a pass voltage having one level to the adjacent word lines in the first program operation and apply a pass voltage that increases in two steps to the adjacent word lines in the second program operation.

Figure 8:
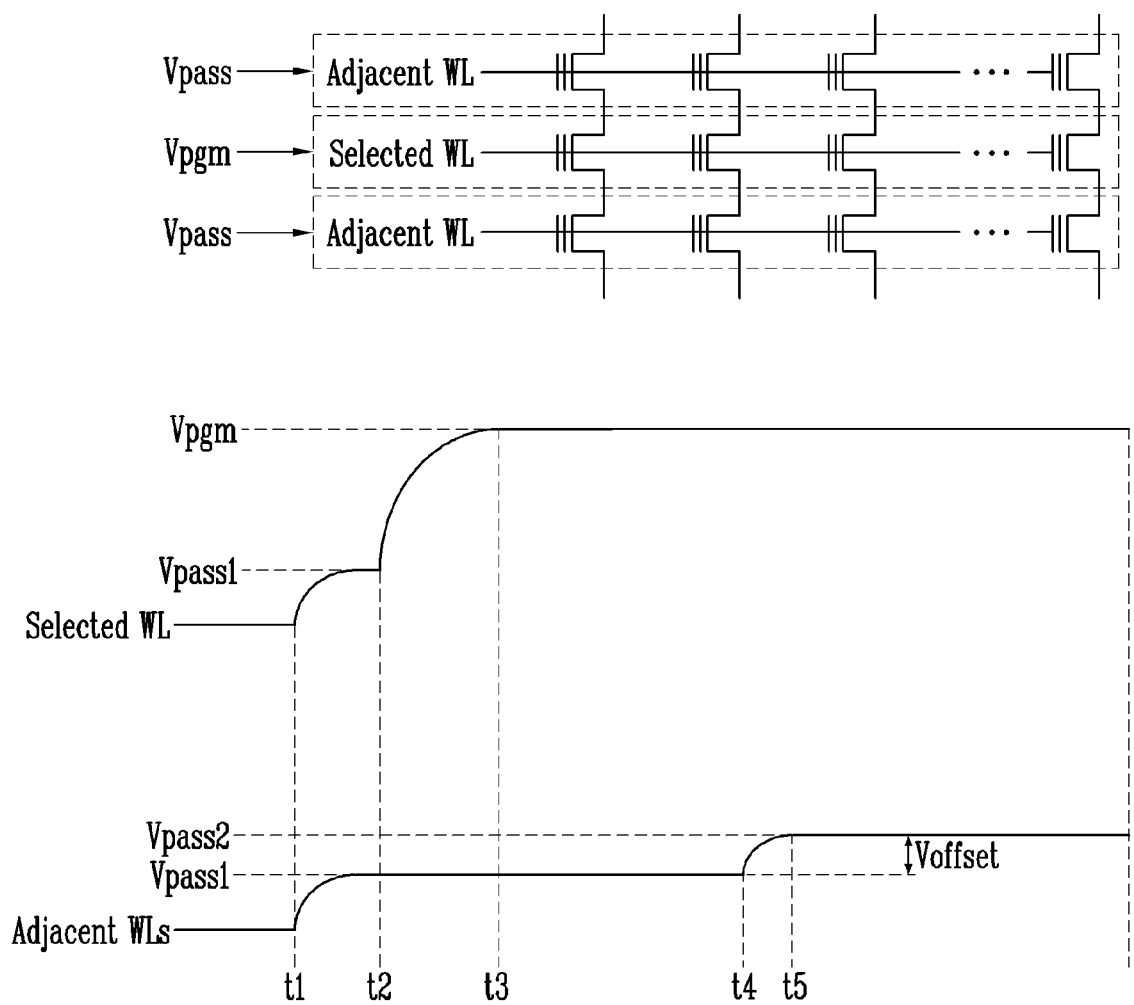
FIG. 8 is a timing diagram of a program voltage and a pass voltage applied to a selected word line and adjacent word lines in a program operation.

FIG. 8 is a timing diagram of the program voltage and the pass voltage applied to the selected word line and the adjacent word lines in the program operation.

An upper diagram of FIG. 8 illustrates a circuit diagram of the selected word line Selected WL and the adjacent word lines Adjacent WL, and a lower graph is a timing diagram illustrating a magnitude of a voltage applied to the selected word line Selected WL and the adjacent word lines Adjacent WL.

Referring to an upper graph, the selected word line Selected WL may be a word line corresponding to a page selected to perform the program operation by the memory controller. During program of the program operation, the memory cells connected to the selected word line Selected WL may be programmed. During the program operation, the program voltage Vpgm may be applied to the selected word line Selected WL. The adjacent word lines Adjacent WL may refer to the word lines adjacent to the selected word line. During the program operation, the pass voltage Vpass may be applied to adjacent word lines Adjacent WL.

Referring to the lower graph, the voltage applied to the selected word line Selected WL may be a voltage that increases in two steps. For example, after a first pass voltage Vpass1 is applied to the selected word line Selected WL, the program voltage Vpgm greater than the first pass voltage Vpass1 may be applied after a predetermined time elapses. The voltage applied to the adjacent word lines Adjacent WLs may be a voltage that increases in two steps. For example, after the first pass voltage Vpass1 is applied to the adjacent word lines Adjacent WLs, after a predetermined time elapses, a second pass voltage Vpass2 of a magnitude increased by an offset voltage Voffset of a predetermined magnitude compared to the first pass voltage Vpass1 may be applied after the predetermined time elapses.

Specifically, at t1, the first pass voltage Vpass1 may be applied to the selected word line Selected WL and the adjacent word lines Adjacent WLs.

After the predetermined time elapses after the first pass voltage Vpass1 is applied to the selected word line Selected WL and adjacent word lines Adjacent WLs, at t2, the program voltage Vpgm may be applied to the selected word line Selected WL. At t3, a potential of the selected word line Selected WL may reach the program voltage Vpgm. At t4, the second pass voltage Vpass2 may be applied to the adjacent word lines Adjacent WLs. At t5, a potential of the adjacent word lines Adjacent WLs may reach the second pass voltage Vpass2.

Magnitudes of the program voltage Vpgm, the first pass voltage Vpass1, and the second pass voltage Vpass2 described with reference to FIG. 8 may be magnitudes set as default values as voltages applied to the selected word line Selected WL or the adjacent word lines Adjacent WLs during the program operation. In addition, during the program operation, time periods for which the program voltage Vpgm, the first pass voltage Vpass1, and the second pass voltage Vpass2 are applied may be time periods set as default values.

The default value may be a predetermined value through an experiment so that the threshold voltage distribution of the memory cells on which the program operation is completed forms the most ideal distribution after a single program operation on the selected memory cells is completed. For example, the default value may be a predetermined value so that the threshold voltage distribution of the selected memory cells to be narrowly formed. Differently from the embodiment described with reference to FIG. 5, the single program operation may refer to an operation in which the program operation is completed with only one program operation. The single program operation may include a plurality of program loops.

Figure 9A:
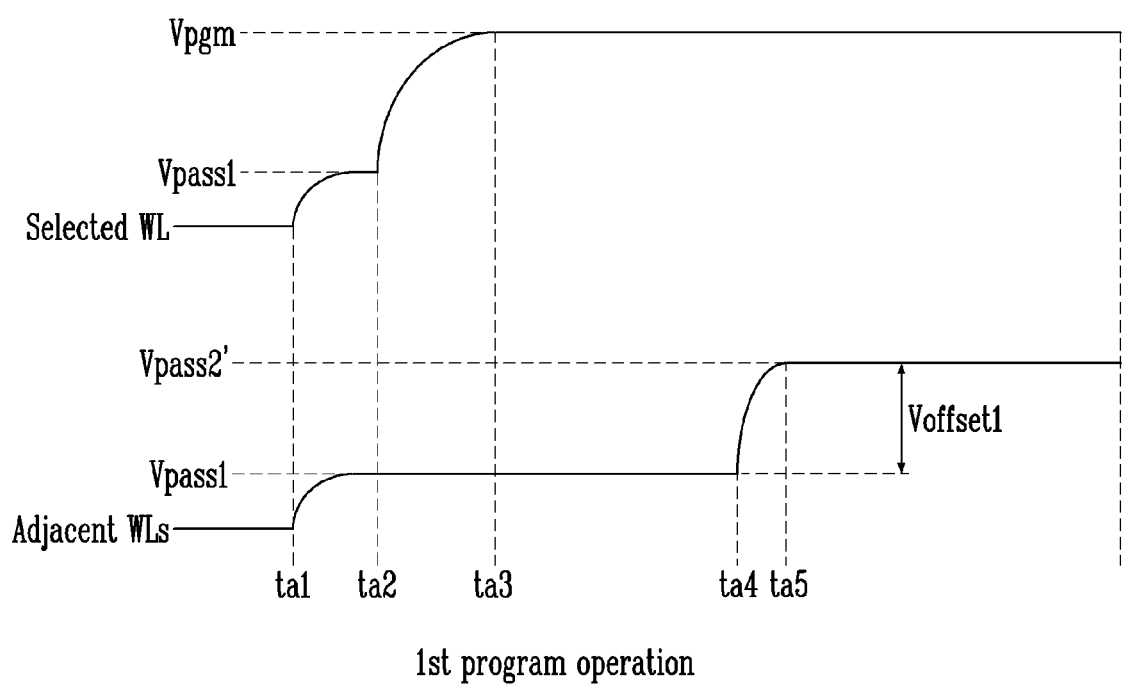
FIG. 9A is a timing diagram of a program voltage and a pass voltage applied to a selected word line and adjacent word lines during a first program operation in an embodiment.

FIG. 9A is a timing diagram of a program voltage and a pass voltage applied to a selected word line and adjacent word lines during a first program operation in an embodiment.

Figure 9B:
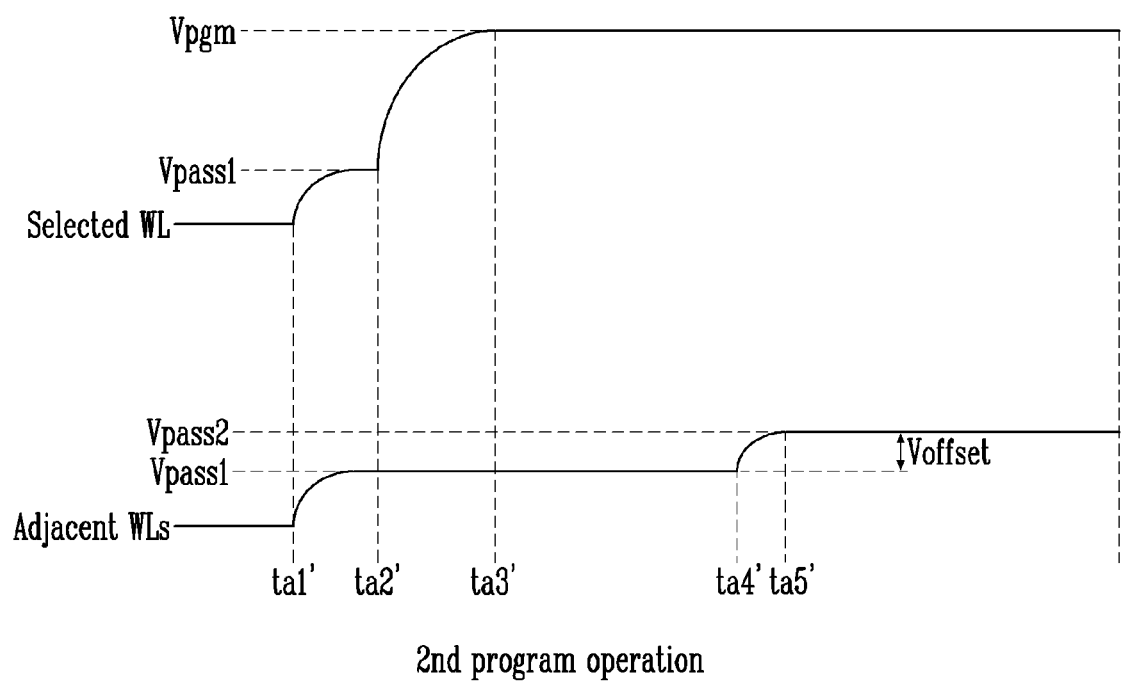
FIG. 9B is a timing diagram of a program voltage and a pass voltage applied to a selected word line and adjacent word lines during a second program operation in an embodiment.

FIG. 9B is a timing diagram of a program voltage and a pass voltage applied to a selected word line and adjacent word lines during a second program operation in an embodiment.

In FIGS. 9A and 9B, because magnitudes and application time points of the voltages applied to the selected word line Selected WL are the same as those described with reference to FIG. 8, a repeated description thereof is omitted here.

In FIG. 9A, the first program operation may be the foggy program operation. The foggy program operation may be an operation of programming the threshold voltage of each of the memory cells connected to the selected word line to correspond to the erase state or any one intermediate state among the plurality of intermediate states corresponding to each of the plurality of states.

In FIG. 9B, the second program operation may be the fine program operation. The fine program operation may be an operation of programming the threshold voltage of each of the selected memory cells to correspond to the target state among the plurality of states after the foggy program operation is performed.

Referring to FIG. 9A, the voltage applied to the adjacent word lines Adjacent WLs in the first program operation may be a voltage that increases in two steps. Specifically, at ta1, the first pass voltage Vpass1 may be applied to the adjacent word lines Adjacent WLs, and at ta4, a second pass voltage Vpass2' increased by a first offset voltage Voffset1 compared to the first pass voltage may be applied to the adjacent word lines Adjacent WLs.

Referring to FIG. 9B, the voltage applied to the adjacent word lines Adjacent WLs in the second program operation may be a voltage that increases in two steps. Specifically, at ta1', the first pass voltage Vpass1 may be applied to the adjacent word lines Adjacent WLs, and at ta4', the second pass voltage Vpass2 may be applied to the adjacent word lines Adjacent WLs.

Referring to FIG. 8 and FIG. 9A a magnitude of the second pass voltage Vpass2' applied to the adjacent word lines Adjacent WLs in the first program operation according to an embodiment may be greater than the magnitude of the second pass voltage Vpass2 set as the default value in FIG. 8. Referring to FIG. 8 and FIG. 9B, the magnitude of the second pass voltage Vpass2 applied to the adjacent word lines Adjacent WLs in the second program operation may be the same as the magnitude of the second pass voltage Vpass2 set as the default value in FIG. 8.

As described with reference to FIGS. 9A and 9B, in the first program operation according to an embodiment, a voltage greater than the second pass voltage set as the default value may be applied to the adjacent word lines Adjacent WLs. In this case, the distribution of the electrons trapped in the charge trap film of the selected memory cells after the first program operation is completed may be widely formed. By widely forming the distribution of the electrons trapped in the charge trap film of the selected memory cells after the first program operation is completed, the threshold voltage distribution of the selected memory cells after the second program operation is completed may be narrowly formed.

Figure 10:
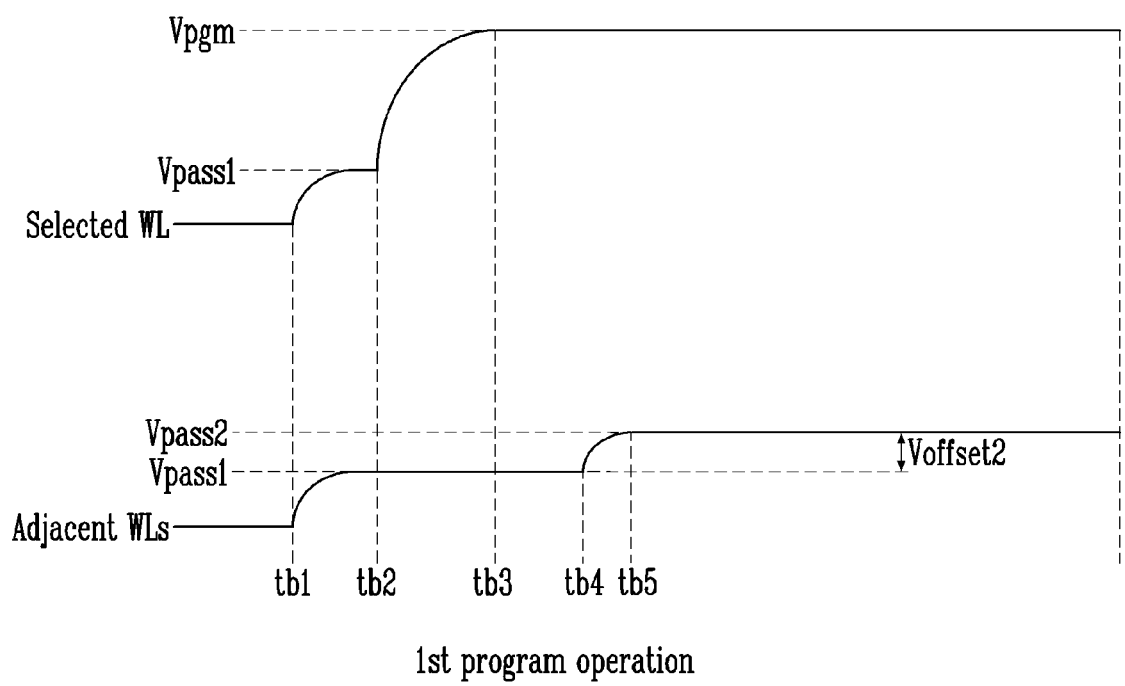
FIG. 10 is a timing diagram of a program voltage and a pass voltage applied to a selected word line and adjacent word lines during a first program operation in another embodiment.

FIG. 10 is a timing diagram of a program voltage and a pass voltage applied to a selected word line and adjacent word lines during a first program operation in another embodiment.

In FIG. 10, because magnitudes and application time points of the voltages applied to the selected word line Selected WL are the same as those described with reference to FIG. 8, a repeated description thereof is omitted here. Because a magnitude and an application time point of the pass voltage applied to the adjacent word lines Adjacent WLs during the second program operation are the same as those described with reference to FIG. 9B, a repeated description thereof is omitted here. The first program operation may be the foggy program operation, and the second program operation may be the fine program operation.

Referring to FIG. 10, the voltage applied to the adjacent word lines Adjacent WLs in the first program operation may be a voltage that increases in two steps. Specifically, at tb1, the first pass voltage Vpass1 may be applied to the adjacent word lines Adjacent WLs, and tb4, a second pass voltage Vpass2 increased by a second offset voltage Voffset2 compared to the first pass voltage may be applied to the adjacent word lines Adjacent WLs. A magnitude of the second pass voltage Vpass2 may be the same as the magnitude of the second pass voltage Vpass2 set as the default value in FIG. 8. The time point tb4 which is a time point at which the second pass voltage Vpass2 is applied may be earlier than the time point t4 which is a time point at which the second pass voltage is applied in FIG. 8. In this case, a length of a time in which the second pass voltage Vpass2 is applied to the adjacent word lines Adjacent WLs in the first program operation may be longer than a length of a time in which the second pass voltage Vpass2 is applied in the second program operation. Because the second pass voltage Vpass2 is applied to the adjacent word lines Adjacent WLs for a long time in the first program operation, the distribution of the electrons trapped in the charge trap film of the selected memory cells after the first program operation is completed may be widely formed. By widely forming the distribution of the electrons trapped in the charge trap film of the selected memory cells after the first program operation is completed, the threshold voltage distribution of the selected memory cells after the second program operation is completed may be narrowly formed.

Figure 11:
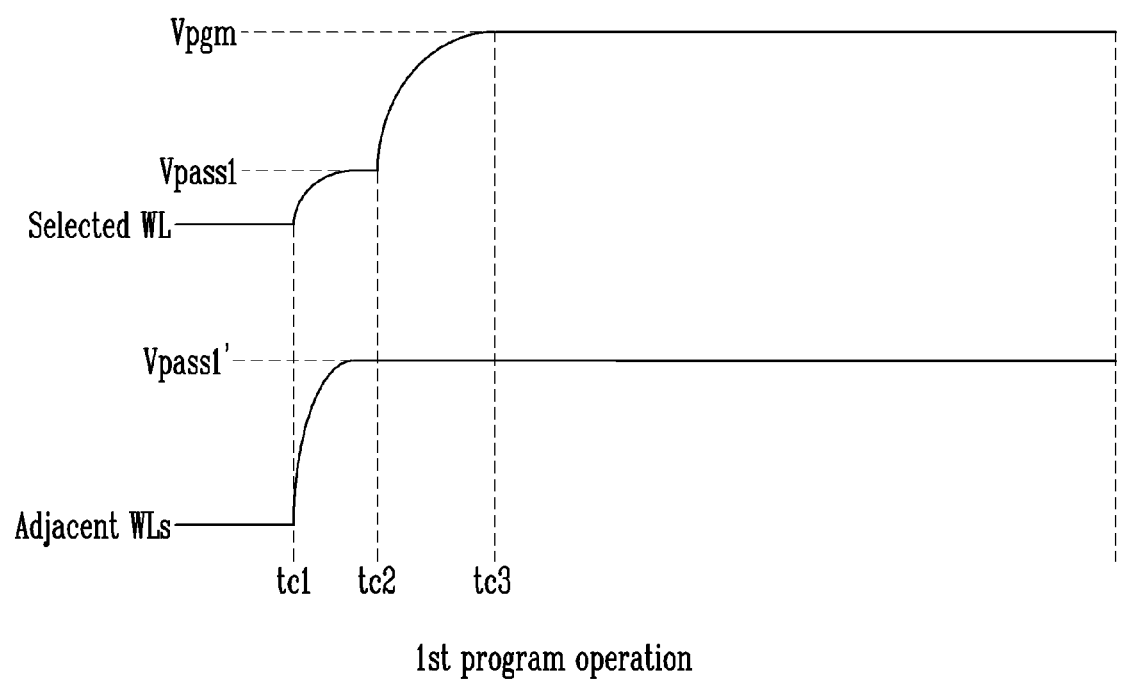
FIG. 11 is a timing diagram of a program voltage and a pass voltage applied to a selected word line and adjacent word lines during a first program operation in still another embodiment.

FIG. 11 is a timing diagram of a program voltage and a pass voltage applied to a selected word line and adjacent word lines during a first program operation in still another embodiment.

In FIG. 11, because magnitudes and application time points of the voltages applied to the selected word line Selected WL are the same as those described with reference to FIG. 8, a repeated description thereof is omitted here. Because a magnitude and an application time point of the pass voltage applied to the adjacent word lines Adjacent WLs during the second program operation are the same as those described with reference to FIG. 9B, a repeated description thereof is omitted here. The first program operation may be the foggy program operation, and the second program operation may be the fine program operation.

Referring to FIG. 11, in an embodiment, a pass voltage having one level may be applied to the adjacent word lines Adjacent WLs in the first program operation. That is, differently from that described with reference to FIGS. 8 to 10, after a first pass voltage Vpass1' is applied to the adjacent word lines Adjacent WLs at tc1, the applied first pass voltage Vpass1' may be maintained. At this time, a magnitude of the first pass voltage Vpass1' may be greater than the magnitude of the first pass voltage Vpass1 set as the default value in FIG. 8.

Because the pass voltage having one level is applied to the adjacent word lines Adjacent WLs in the first program operation, the distribution of the electrons trapped in the charge trap film of the selected memory cells after the first program operation is completed may be widely formed. By widely forming the distribution of the electrons trapped in the charge trap film of the selected memory cells after the first program operation is completed, the threshold voltage distribution of the selected memory cells after the second program operation is completed may be narrowly formed.

Figure 12:
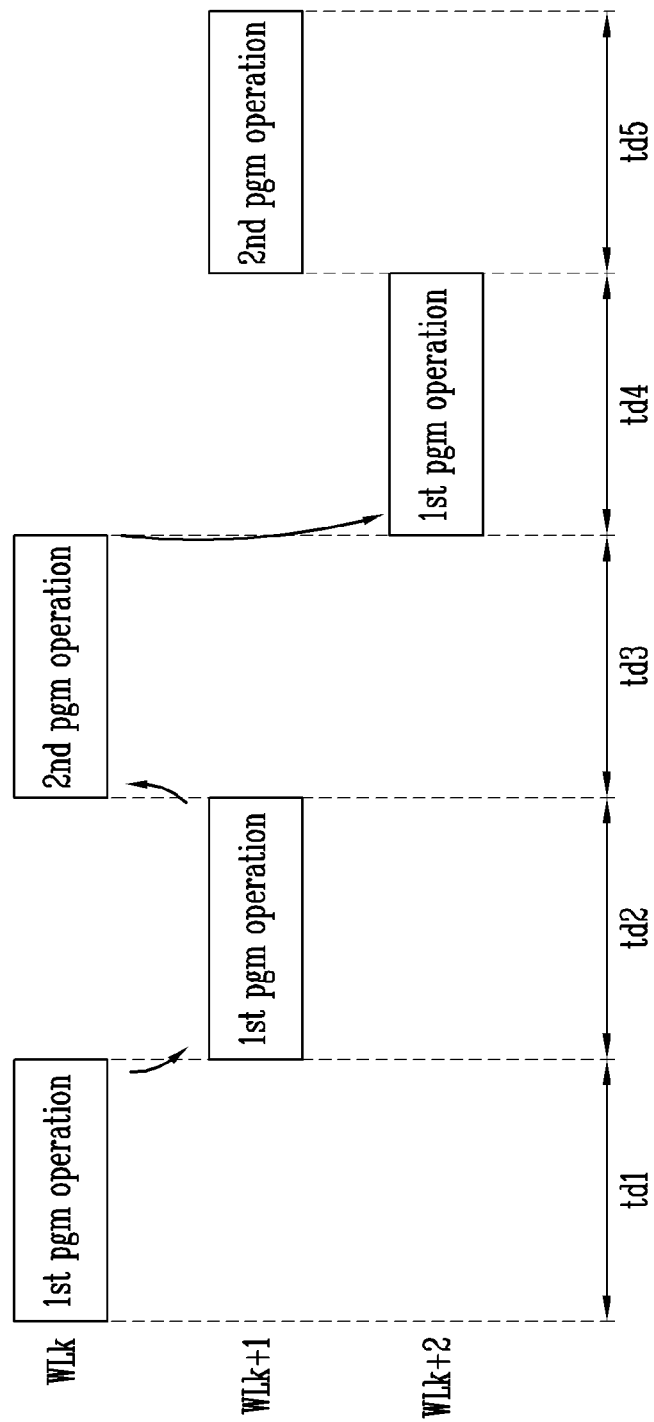
FIG. 12 is a diagram illustrating a sequence of a program operation according to an embodiment.

FIG. 12 is a diagram illustrating a sequence of a program operation according to an embodiment.

In FIG. 12, a vertical axis may represent a physical position of the word lines, and a horizontal axis may represent a time in which the program operation is performed.

Referring to FIG. 12, a k-th word line WLk, a (k+1)-th word line WLk+1, and a (k+2)-th word line WLk+2 may be three word lines adjacent to each other in the memory block. The program operation may be performed in a direction from the k-th word line WLk to the (k+2)-th word line WLk+2.

In an embodiment, the memory device may alternately perform the first program operation and the second program operation on memory cells connected to adjacent word lines. For example, instead of performing the second program operation immediately after performing the first program operation on the memory cells connected to the selected word line, the first program operation on the memory cells connected to the adjacent word line may be first performed.

Specifically, the first program operation may be performed on memory cells connected to the k-th word line WLk during td1. The first program operation may be the foggy program operation.

After the first program operation on the memory cells connected to the k-th word line WLk is completed, the first program operation on memory cells connected to the (k+1)-th word line WLk+1 may be performed during td2.

After the first program operation on the memory cells connected to the (k+1)-th word line WLk+1 is completed, a second program operation on the memory cells connected to the k-th word line WLk may be performed during td3. The second program operation may be the fine program operation.

After the second program operation on the memory cells connected to the k-th word line WLk is completed, a first program operation on memory cells connected to the (k+2)-th word line WLk+2 may be performed during td4.

After the first program operation on the memory cells connected to the (k+2)-th word line WLk+2 is completed, a second program operation on the memory cells connected to the (k+1)-th word line WLk+1 may be performed during td5. Thereafter, although not illustrated, a first program operation on the memory cells connected to a (k+3)-th word line WLk+3 may be performed before performing a second program operation on the memory cells connected to the (k+2)-th word line WLk+2.

As described with reference to FIG. 12, when the first program operation and the second program operation are alternately performed on the memory cells connected to the adjacent word lines, the distribution of the electrons trapped in the charge trap film during a time until the second program operation is performed after the first program operation is completed may be widely formed. By widely forming the distribution of the electrons trapped in the charge trap film of the selected memory cells after the first program operation is completed, the threshold voltage distribution of the selected memory cells after the second program operation is completed may be narrowly formed.

Figure 13:
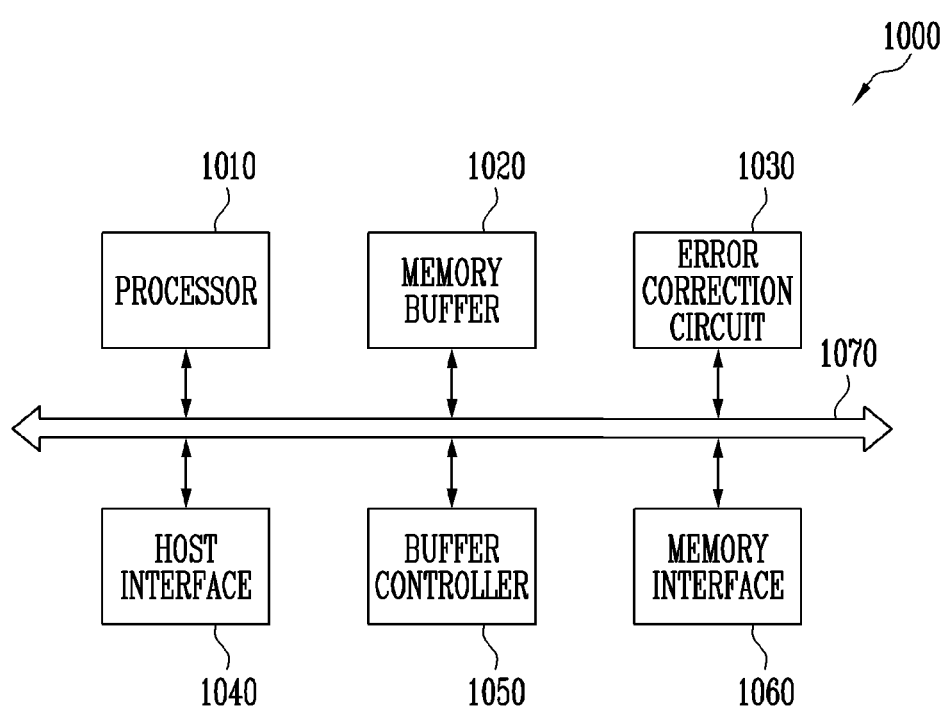
FIG. 13 is a diagram illustrating an embodiment of a memory controller of FIG. 1.

FIG. 13 is a diagram illustrating an embodiment of a memory controller 1000, which may represent the memory controller 200 of FIG. 1.

Referring to FIG. 13, the memory controller 1000 is connected to a host and the memory device. The memory controller 1000 is configured to access the memory device in response to a request from the host. For example, the memory controller 1000 is configured to control the write, read, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction circuit (ECC) 1030, a host interface 1040, a buffer controller 1050, a memory interface 1060, and a bus 1070.

The bus 1070 may be configured to provide a channel between components of the memory controller 1000.

The processor 1010 may control an overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of an FTL. The processor 1010 may convert an LBA provided by the host into a PBA through the FTL. The FTL may receive the LBA using a mapping table and convert the LBA into the PBA. An address mapping method of the flash translation layer may include various methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a de-randomizing seed. The de-randomized data may be output to the host.

As an embodiment, the processor 1010 may perform the randomization and the de-randomization by driving software or firmware.

The memory buffer 1020 may be used as operation memory, cache memory, or buffer memory of the processor 1010. The memory buffer 1020 may store codes and commands executed by the processor 1010. The memory buffer 1020 may store data processed by the processor 1010. The memory buffer 1020 may include static RAM (SRAM) or dynamic RAM (DRAM).

The ECC 1030 may perform error correction. The ECC 1030 may perform error correction encoding (ECC encoding) based on data to be written to the memory device through memory interface 1060. The error correction encoded data may be transferred to the memory device through the memory interface 1060. The ECC 1030 may perform error correction decoding (ECC decoding) on the data received from the memory device through the memory interface 1060. For example, the ECC 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a nonvolatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the ECC 1030, and the memory interface 1060. The control bus may be connected to the host interface 1040, the processor 1010, the buffer controller 1050, the memory buffer 1020, and the memory interface 1060.

Figure 14:
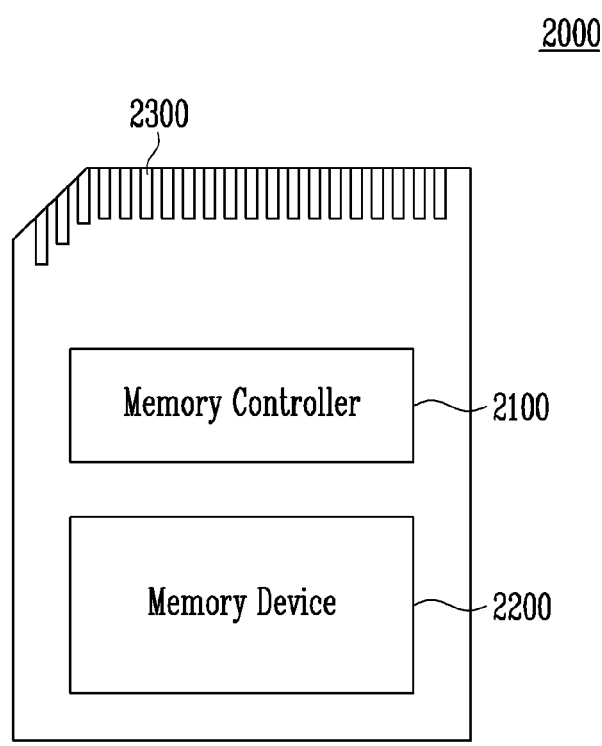
FIG. 14 is a block diagram illustrating a memory card system to which a storage device according to an embodiment of the present disclosure is applied.

FIG. 14 is a block diagram illustrating a memory card system 2000 to which a storage device according to an embodiment of the present disclosure is applied. The memory card system 2000 may be an example of a system implemented using the storage device 50 of FIG. 1.

Referring to FIG. 14, the memory card system 2000 includes a memory controller 2100, a memory device 2200, and a connector 2300.

The memory controller 2100 may be implemented identically to the memory controller 200 described with reference to FIG. 1.

For example, the memory controller 2100 may include components such as random access memory (RAM), a processor, a host interface, a memory interface, and an ECC.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

What is claimed is:

1. A memory device comprising:
    memory cells connected to a selected word line among a plurality of word lines;
    a peripheral circuit configured to perform a first program operation of programming a threshold voltage of each of memory cells that are to be programmed among the memory cells to a pre-threshold voltage less than a target threshold voltage, and perform a second program operation of programming the threshold voltage of each of the memory cells which are to be programmed to the target threshold voltage after the first program operation is performed; and
    control logic configured to control the peripheral circuit such that a first pass voltage and a second pass voltage are sequentially applied to adjacent word lines adjacent to the selected word line, when a program voltage is applied to the selected word line, in the first program operation and the second program operation,
    wherein a magnitude of the second pass voltage applied to the adjacent word lines in the first program operation is greater than a magnitude of the second pass voltage applied to the adjacent word lines in the second program operation.

2. The memory device of claim 1, wherein the control logic is configured to control the peripheral circuit to perform the first program operation on memory cells connected to a first selected word line and thereafter perform the first program operation on memory cells connected to a second selected word line before performing the second program operation on memory cells connected to the first selected word line.

3. The memory device of claim 2, wherein the control logic is further configured to control the peripheral circuit to perform the first program operation on memory cells connected to a third selected word line after performing the second program operation on the memory cells connected to the first selected word line and before performing the second program operation on the memory cells connected to the second selected word line.

4. The memory device of claim 1, wherein a time period for which the second pass voltage is applied to the adjacent word lines in the first program operation is longer than a time period for which the second pass voltage is applied to the adjacent word lines in the second program operation.

5. The memory device of claim 4, wherein in the first program operation, a time period for which the second pass voltage is applied to the adjacent word lines is longer than a time period for which the first pass voltage is applied to the adjacent word lines, and
    in the second program operation, a time period for which the second pass voltage is applied to the adjacent word lines is shorter than a time period which the first pass voltage is applied to the adjacent word lines.

6. The memory device of claim 1, wherein the magnitude of the second pass voltage applied to the adjacent word lines in the first program operation and the magnitude of the second pass voltage applied to the adjacent word lines in the second program operation are greater than a magnitude of the first pass voltage.

7. A method of operating a memory device performing a program operation on memory cells connected to a selected word line among a plurality of word lines, the method comprising:
    performing a first program operation of programming a threshold voltage of each of memory cells that are to be programmed among memory cells connected to the selected word line to a pre-threshold voltage less than a target threshold voltage; and
    performing a second program operation of programming the threshold voltage of each of the memory cells which are to be programmed to the target threshold voltage after the first program operation is performed,
    wherein each of the first program operation and the second program operation includes applying a program voltage to the selected word line and sequentially applying a first pass voltage and a second pass voltage to adjacent word lines adjacent to the selected word line, and
    wherein a magnitude of the second pass voltage applied to the adjacent word lines in the first program operation is greater than a magnitude of the second pass voltage applied to the adjacent word lines in the second program operation.

8. The method of claim 7, further comprising performing the second program operation on the memory cells connected to a word line selected before the selected word line is selected, after the first program operation on the memory cells connected to the selected word line is performed.

9. The method of claim 8, further comprising performing the first program operation on memory cells connected to a word line to be selected next to the selected word line, after the second program operation on the memory cells connected to the word line selected before the selected word line is selected is performed.

10. The method of claim 7, wherein the magnitude of the second pass voltage applied to the adjacent word lines in the first program operation and the magnitude of the second pass voltage applied to the adjacent word lines in the second program operation are greater than a magnitude of the first pass voltage.

11. The method of claim 7, wherein a time period for which the second pass voltage is applied to the adjacent word lines in the first program operation is longer than a time period for which the second pass voltage is applied to the adjacent word lines in the second program operation.

12. The method of claim 11, wherein in the first program operation, a time period for which the second pass voltage is applied to the adjacent word lines is longer than a time period for which the first pass voltage is applied to the adjacent word lines, and in the second program operation, a time period for which the second pass voltage is applied to the adjacent word lines is shorter than a time period for which the first pass voltage is applied to the adjacent word lines.

13. A memory device comprising:
memory cells connected to a selected word line among a plurality of word lines;
a peripheral circuit configured to perform a first program operation of programming a threshold voltage of each of memory cells that are to be programmed among the memory cells to a pre-threshold voltage less than a target threshold voltage, and perform a second program operation of programming the threshold voltage of each of the memory cells, which are to be programmed, to the target threshold voltage after the first program operation is performed; and
control logic configured to control the peripheral circuit to apply a program voltage to the selected word line and apply a pass voltage to adjacent word lines adjacent to the selected word line in the first program operation, and apply the program voltage to the selected word line and sequentially apply a first pass voltage and a second pass voltage to the adjacent word lines in the second program operation,
wherein a magnitude of the second pass voltage applied to the adjacent word lines in the first program operation is greater than or equal to a magnitude of the second pass voltage applied to the adjacent word lines in the second program operation.

14. The memory device of claim 13, wherein the control logic is configured to control the peripheral circuit to perform the first program operation on memory cells connected to a first selected word line and thereafter perform the first program operation on memory cells connected to a second selected word line before performing the second program operation on memory cells connected to the first selected word line.

15. The memory device of claim 14, wherein the control logic is further configured to control the peripheral circuit to perform the first program operation on memory cells connected to a third selected word line after performing the second program operation on the memory cells connected to the first selected word line and before performing the second program operation on the memory cells connected to the second selected word line.

16. The memory device of claim 13, wherein the magnitude of the second pass voltage applied to the adjacent word lines in the first program operation and the magnitude of the second pass voltage applied to the adjacent word lines in the second program operation are greater than a magnitude of the first pass voltage.

* * * * *